(12) United States Patent
Li et al.

(10) Patent No.: US 11,670,906 B2
(45) Date of Patent: Jun. 6, 2023

(54) NARROW-PULSE-WIDTH PULSE LASER (71) Applicant: Tanway Technology (Beijing) Co., Ltd, Beijing (CN)

(72) Inventors: Hongpeng Li, Beijing (CN); Baige Wang, Beijing (CN); Ruitong Zheng, Beijing (CN); Luofeng Shen, Beijing (CN)

(73) Assignee: Tanway Technology (Beijing) Co., Ltd

( * ) Notice: Subject to any disclaimer, the term of this patent is extended or adjusted under 35 U.S.C. 154(b) by 0 days.

(21) Appl. No.: 17/821,322

(22) Filed: Aug. 22, 2022

(65) Prior Publication Data

US 2023/0093567 A1 Mar. 23, 2023

Related U.S. Application Data (63) Continuation-in-part of application No. PCT/CN2022/084787, filed on Apr. 1, 2022.

(30) Foreign Application Priority Data

Sep. 22, 2021 (CN) .......................... 202111108969.7

(51) Int. Cl.
*H01S 5/042* (2006.01)
*H01S 5/062* (2006.01)

(52) U.S. Cl.
CPC .......... *H01S 5/0428* (2013.01); *H01S 5/0421* (2013.01); *H01S 5/06203* (2013.01); *H01S 5/06216* (2013.01); *H01S 2301/08* (2013.01)

(58) Field of Classification Search
CPC .................................................. H01S 5/06203
(Continued)

(56) References Cited

U.S. PATENT DOCUMENTS

2016/0308330 A1* 10/2016 Liffran ................. H01S 5/0428
2018/0128904 A1   5/2018 Haslim
2019/0191527 A1   6/2019 Rock et al.

FOREIGN PATENT DOCUMENTS

CN   101378177 A   3/2009
CN   103647214 A   3/2014
(Continued)

OTHER PUBLICATIONS

China National Intellectual Property Administration (ISA/CN), International Search Report for PCT/CN2022/084787, dated May 26, 2022, 8 pages.
(Continued)

*Primary Examiner* — Tuan N Nguyen
(74) *Attorney, Agent, or Firm* — Jaffery Watson Mendonsa & Hamilton LLP (57) ABSTRACT

The present disclosure provides a narrow-pulse-width pulse laser, including a circuit substrate, a laser chip, one or more capacitors, and a field effect transistor. Each of the field effect transistor, the capacitor, and the laser chip is electrically connected to the circuit substrate. The capacitors are arranged between the field effect transistor and the laser chip along an extension direction of a gap between the field effect transistor and the laser chip. The circuit substrate may include a first conductor layer; a second conductor layer; and an insulating layer arranged between the first conductor layer and the second conductor layer, wherein the first conductor layer and the second conductor layer are electrically connected through a via hole in the insulating layer.

6 Claims, 6 Drawing Sheets (58) Field of Classification Search
USPC .......................................................... 372/84
See application file for complete search history.

(56) References Cited

FOREIGN PATENT DOCUMENTS

| | | |
|---|---|---|
| CN | 204858269 U | 12/2015 |
| CN | 106486887 A | 3/2017 |
| CN | 206041199 U | 3/2017 |
| CN | 111224317 A | 6/2020 |
| CN | 113555767 A | 10/2021 |
| CN | 113933815 A | 1/2022 |
| CN | 114122908 A | 3/2022 |

OTHER PUBLICATIONS

China National Intellectual Property Administration (ISA/CN), Written Opinion of the International Searching Authority for PCT/CN2022/084787, dated May 27, 2022, 10 pages.
The State Intellectual Property Office of People's Republic of China, First Office Action for Chinese Patent Application No. 202111108969.7, dated Nov. 11, 2021, 15 pages.
The State Intellectual Property Office of People's Republic of China, Second Office Action for Chinese Patent Application No. 202111108969.7, dated Dec. 10, 2021, 12 pages.

\* cited by examiner

NARROW-PULSE-WIDTH PULSE LASER

CROSS REFERENCE TO RELATED APPLICATIONS

The present application is a continuation-in-part of International Application No. PCT/CN2022/084787, filed on Apr. 1, 2022, entitled "NARROW-PULSE-WIDTH PULSE LASER," which claims the priority to Chinese patent application No. 202111108969.7, entitled "NARROW-PULSE-WIDTH PULSE LASER," filed on Sep. 22, 2021, the entire contents of each of which are incorporated herein by reference.

TECHNICAL FIELD

The present invention relates to the technical field of pulse lasers, and more particularly, to narrow-pulse-width pulse lasers.

BACKGROUND

A laser sensor, such as a "LiDAR" (Light Detection and Ranging) sensor, is an active sensor that can scan a surface of an object using a laser signal with a specific wavelength to acquire relevant characteristic information of the surface of the object. Compared with ordinary microwave radars, the laser sensor or LIDAR sensor may exhibit desirable features such as high resolution, good concealment, strong anti-interference ability, small volume, and light weight. Most existing laser sensors use a Time of Flight (TOF) ranging scheme in which a pulse laser is used as a transmitting terminal. The performance of almost all types of laser sensors may be measured by parameters such as a limit ranging distance, a point cloud density, a ranging accuracy and a measurement repeatability are all important parameters characterizing detection performances of the laser sensors.

In laser sensors that use a pulse laser as the transmitting terminal, a pulse width of a light pulse of the pulse laser is one of parameters limiting the point cloud density, the ranging accuracy, the measurement repeatability, and a limit ranging distance of the laser sensor. An existing pulse laser has a wide pulse width, and a corresponding laser sensor of the pulse laser has a low point cloud density, poor ranging accuracy and repeatability, and a short limit ranging distance.

SUMMARY

(I) Technical Problems to be Solved

The present disclosure provides solutions for the problems that existing pulse lasers have a wide pulse width and that existing laser sensors (e.g., LiDARs) incorporating such pulse lasers have a low point cloud density, poor ranging accuracy and repeatability, and a short limit ranging distance.

(II) Technical Solutions

To solve the above technical problems, an embodiment of the present disclosure provides a narrow-pulse-width pulse laser, including:
a circuit substrate, a laser chip, one or more capacitors, and a field effect transistor, wherein the field effect transistor, the capacitor and the laser chip are all electrically connected to the circuit substrate.

The one or more capacitors may be arranged between the field effect transistor and the laser chip along an extension direction of a gap between the field effect transistor and the laser chip.

In some embodiments, the circuit substrate comprises a first conductor layer, a second conductor layer, and an insulating layer arranged between the first conductor layer and the second conductor layer. The first conductor layer and the second conductor layer are electrically connected through a via hole in the insulating layer.

In some embodiments, along a direction from the first conductor layer to the second conductor layer, a thickness H of the insulating layer satisfies that H≤0.075 mm.

In some embodiments, the first conductor layer comprises a first planar conductor, and the second conductor layer comprises a second planar conductor.

In some embodiments, each of the field effect transistor, the capacitor, and the laser chip is electrically connected to the first conductor. The vertical projections of the field effect transistor, the capacitor, and the laser chip on the circuit substrate are all located in the first conductor.

In some embodiments, along the extension direction of the gap between the field effect transistor and the laser chip, relationships among a width $W_1$ of the laser chip, a total width $W_2$ of the capacitors, a width $W_0$ of the field effect transistor and a width W of the first conductor satisfy that: $W_1 \leq W_0$, $W_2 \leq W_0$, and $W_0 \leq W \leq 1.1 W_0$.

In some embodiments, the narrow-pulse-width pulse laser includes a plurality of capacitors. Along the extension direction of the gap between the field effect transistor and the laser chip, a gap $W_3$ between two adjacent capacitors satisfies that: 100 μm≤$W_3$≤120 μm.

In some embodiments, along a direction from the field effect transistor to the laser chip, a gap $L_1$ between the capacitor and the field effect transistor satisfies that: 300 μm≤$L_1$≤360 μm.

In some embodiments, along a direction from the field effect transistor to the laser chip, a gap $L_2$ between the capacitor and the laser chip satisfies that: 200 μm≤$L_2$≤240 μm.

In an embodiment, along a direction perpendicular to a plane in which the circuit substrate is located, a height of the capacitor is smaller than that of the field effect transistor, and a height of the laser chip is smaller than that of the field effect transistor.

In some embodiments, the capacitor comprises a bare-die capacitor, and the laser chip comprises a laser bare chip.

In some embodiments, the pulse laser further comprises a gold wire.

On one side far away from the circuit substrate, the bare-die capacitor and the laser bare chip are connected through the gold wire.

In some embodiments, the bare-die capacitor is a thin film silicon capacitor.

In some embodiments, the field effect transistor is a gallium nitride enhanced mode power transistor.

In some embodiments, the pulse laser further comprises an insulating paste.

In some embodiments, the insulating paste covers the bare-die capacitor, the laser bare chip, the gold wire, and bare areas of the field effect transistor and the circuit substrate to provide insulation protection.

(III) Beneficial Effects

Compared with the prior art, the technical solutions described herein have the following advantages.

The narrow-pulse-width pulse laser in accordance with some embodiments of the present disclosure comprises the circuit substrate, the laser chip, the capacitor and the field effect transistor, wherein the field effect transistor, the capacitor and the laser chip are all electrically connected onto the circuit substrate, and the capacitor is arranged between the field effect transistor and the laser chip along the extension direction of the gap between the field effect transistor and the laser chip, thus optimizing a layout of structural components in the pulse laser. Specifically, by arranging the capacitors between the field effect transistor and the laser chip in a column instead of a row, the layout of the structural components can be more compact, and the more compact the layout is, the smaller the loop inductance is, the faster the discharge is, and the narrower the pulse width is. Therefore, it is beneficial for reducing the loop inductance of the pulse laser, thus making a discharge velocity of the pulse laser faster and narrowing a pulse width of a light pulse output by the pulse laser during operation, so as to realize the narrow-pulse-width pulse laser. Application of the pulse laser in the laser sensor is beneficial for improving a point cloud density, a ranging accuracy, measurement repeatability and a limit ranging distance of the laser sensor.

It should be understood that the above general description and the following detailed description are exemplary and explanatory only and cannot limit the present disclosure.

BRIEF DESCRIPTION OF THE DRAWINGS

The drawings herein are incorporated into the specification and constitute a part of the specification, show the embodiments that conform to the present disclosure, and are used for describing the principle of the present disclosure together with the specification.

In order to illustrate the embodiments of the present disclosure or the technical solutions in the prior art more clearly, the drawings needed to be used in the description of the embodiments or the prior art will be briefly introduced hereinafter. Obviously, for those of ordinary skills in the art, other drawings may also be obtained according to these drawings without going through creative works.

In the drawings: 1 refers to the one or more capacitors; 2 refers to the circuit substrate. 3 refers to the laser chip; 4 refers to the field effect transistor; 5 refers to the first conductor layer; 6 refers to the second conductor layer; 7 refers to the insulating layer; 8 refers to the insulating paste; 9 refers to the first conductor; 10 refers to the second conductor; and 11 refers to gold wires.

DETAILED DESCRIPTION

In order to make the objects, technical solutions, and advantages of the embodiments of the present disclosure more clearly, the technical solutions in the embodiments of the present disclosure will be described clearly and completely below. Obviously, the described embodiments are some, but not all, embodiments of the present disclosure. Based on the embodiments in the present disclosure, all other embodiments obtained by those of ordinary skills in the art without going through creative works shall fall within the scope of protection of the present disclosure.

It should be understood that the serial numbers of the steps used herein are only for convenience of description and are not used for limiting an executing sequence of the steps.

It should be understood that the terms used in the specification of the present invention are for the purpose of describing specific embodiments only and are not intended to limit the present invention. As used in the specification and the appended claims of the present invention, the singular forms of "a" "one" and the are intended to include the plural forms, unless the context clearly indicates otherwise.

The terms "comprising" and "containing" indicate the presence of described features, entireties, steps, operations, elements and/or components, but do not exclude the presence or addition of one or more other features, entireties, steps, operations, elements, components and/or combinations thereof.

The term "and/or" refers to any combination and all possible combinations of one or more of the associated listed items and includes these combinations.

Figure 1:
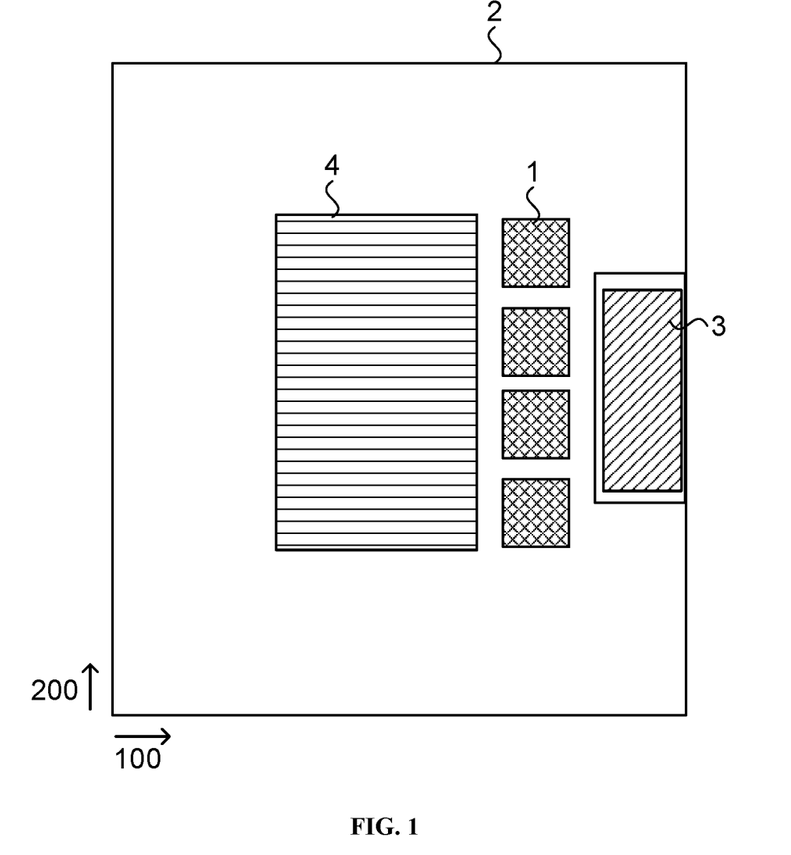
FIG. 1 is a schematic diagram of a cross-sectional view of a narrow-pulse-width pulse laser in accordance with some embodiments of the present disclosure.

FIG. 1 is a schematic diagram of a cross-sectional view of a narrow-pulse-width pulse laser in accordance with some embodiments of the present disclosure. FIG. 1 also provides a layout method of a narrow-pulse-width laser circuit and a pulse laser. As shown, a pulse laser may include a circuit substrate 2, a laser chip 3, one or more capacitors 1, and a field effect transistor 4.

Each of the field effect transistor 4, the capacitors 1, and the laser chip 3 is electrically connected to the circuit substrate 2.

The capacitor(s) 1 may be arranged between the field effect transistor 4 and the laser chip 3 along an extension direction 200 of a gap between the field effect transistor 4 and the laser chip 3. That is, the capacitor(s) 1 may be arranged in a column in the strip-shaped gap between the field effect transistor 4 and the laser chip 3.

As shown in FIG. 1, 100 represents a direction from the field effect transistor 4 to the laser chip 3, which is also referred to as a width direction of the gap between the field effect transistor and the laser chip. 200 may also be referred to as a length direction of the gap between the field effect transistor 4 and the laser chip 3.

The capacitors 1, the laser chip 3, and the field effect transistor 4 are connected in series in sequence.

Figure 2:
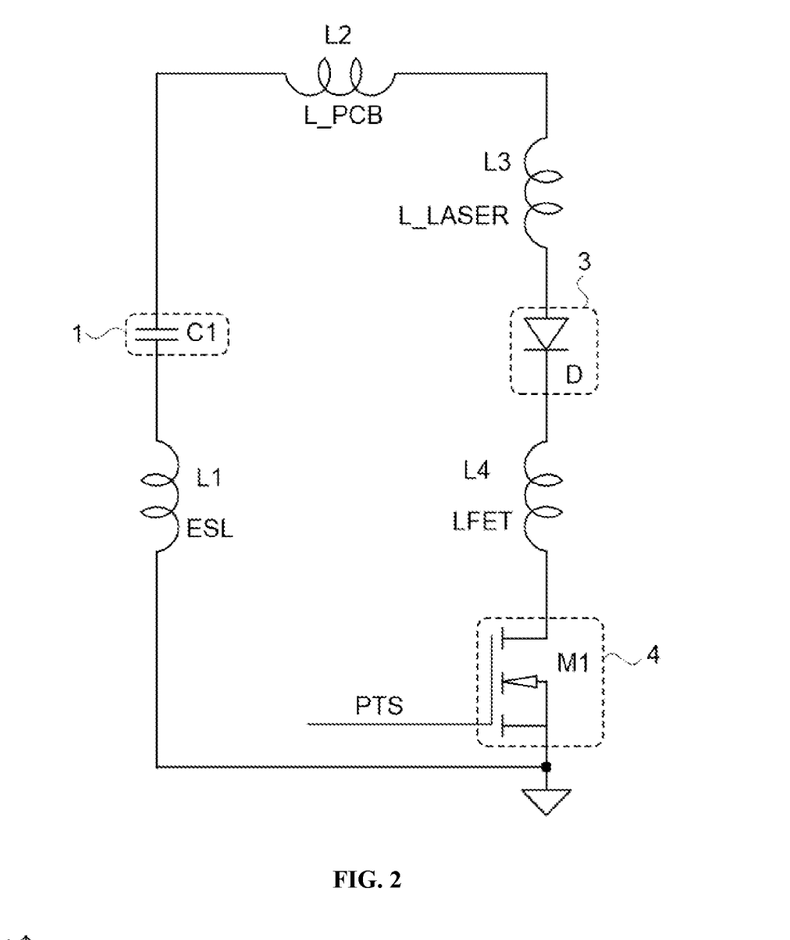
FIG. 2 is a schematic diagram illustrating an equivalent inductance of a narrow-pulse-width pulse laser in accordance with some embodiments of the present disclosure.

FIG. 2 is a schematic diagram illustrating an equivalent inductance of the narrow-pulse-width pulse laser in accordance with some embodiments of the present disclosure. As illustrated, a total loop inductance of the pulse laser include an Equivalent Series Inductance (ESL) (which is namely L1) of the capacitor, a parasitic inductance L_PCB (referred to as L2) of circuit routing in the circuit substrate, a parasitic inductance L_LASER (referred to as L3) of the laser chip, and a parasitic inductance LFET (referred to as L4) of the field effect transistor which are connected in series. The total loop inductance may be regarded as being equal to a sum of the four inductances described above, namely L1+L2+L3+L4.

The Equivalent Series Inductance (ESL) of the capacitors, the parasitic inductance L_LASER of the laser chip and the parasitic inductance LFET of the field effect transistor are related to selected types and the layout of corresponding structural components. In the case that the selected types are defined, the three inductances described above can be reduced by optimizing the layout of the structural components.

The parasitic inductance L_PCB of circuit routing in a circuit substrate 2 may be calculated using the following formula:

$$\mathrm{L\_PCB} = \frac{400\pi\mu_r HL}{W}, \quad (1)$$

where $\mu_r$ represents a relative magnetic permeability of an insulating layer in the circuit substrate 2; H is a distance between a grounding layer and a connecting layer (a first conductor layer and a second conductor layer below) in the circuit substrate 2; L is a length of the circuit routing; and W represents a width of the circuit routing.

According to formular (1), on the premise that the circuit substrate 2 has a limited material selection range, three parameters including the distance H between the grounding layer and the connecting layer, the length L of the circuit routing, and the width W of the circuit routing can be improved. For example, the distance H between the grounding layer and the connecting layer in the circuit substrate 2 may be reduced, while a laser chip 3, a capacitor 1, and a field effect transistor 4 may be compactly arranged to reduce the length L of the circuit routing and increase the width W of the circuit routing. As will be described in greater detail below, this may reduce the parasitic inductance L_PCB of the circuit routing in the circuit substrate 2, thus reducing a total loop inductance of the pulse laser.

Figure 3:
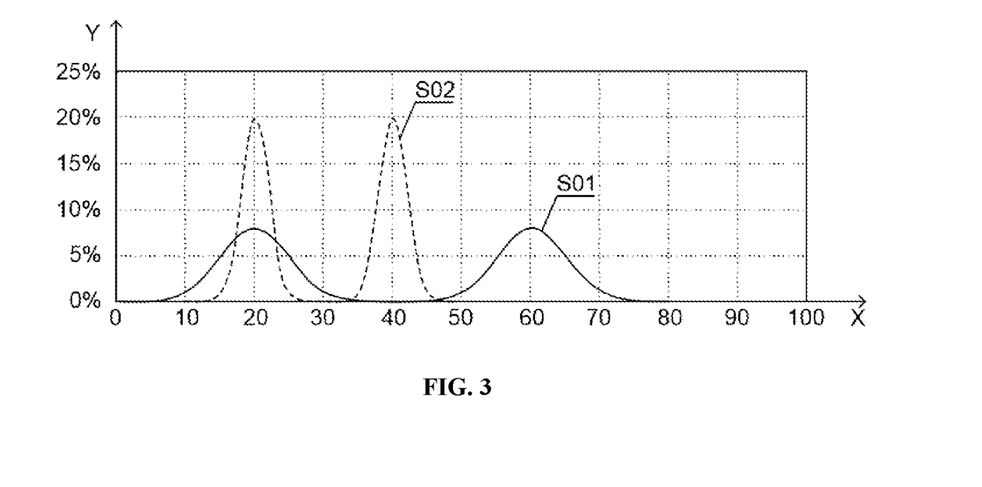
FIG. 3 is a schematic diagram of repetition frequency comparison between the narrow-pulse-width pulse laser in accordance with some embodiments of the present disclosure and a pulse laser in the related art.
Figure 4:
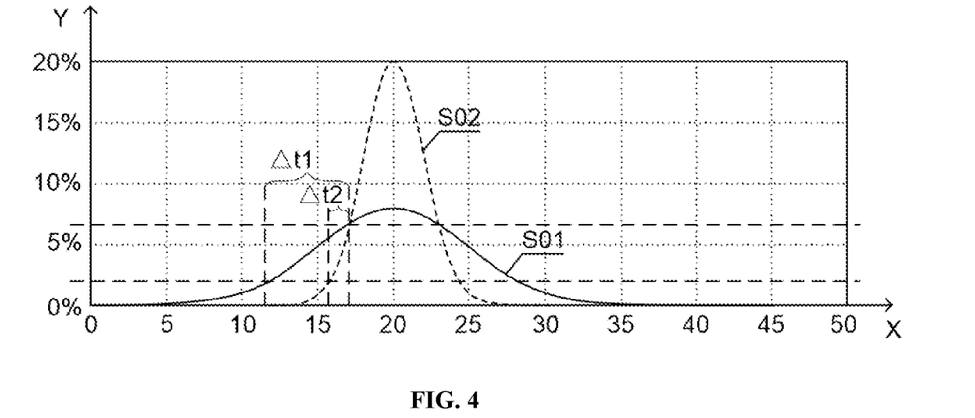
FIG. 4 is a schematic diagram of timing accuracy comparison between the narrow-pulse-width pulse laser in accordance with some embodiments of the present disclosure and the pulse laser in the related art.

FIG. 3 is a schematic diagram showing repetition frequency comparison between the narrow-pulse-width pulse laser in accordance with some embodiments of the present disclosure and a pulse laser in the related art, which shows limit pulse repetition frequencies of lasers with different pulse widths;

FIG. 4 is a schematic diagram of timing accuracy comparison between the narrow-pulse-width pulse laser in accordance with some embodiments of the present disclosure and the pulse laser in the related art, which shows timing accuracies of the lasers with different pulse widths. In the drawings, an abscissa axis X represents a time, in a physical unit of nanosecond (ns); an ordinate axis Y represents a relative peak power, expressed as a percentage; and S01 and S02 respectively represent two different pulse curves, wherein S01 may represent a pulse output by the pulse laser in the related art, and S02 may represent a pulse output by the pulse laser in accordance with some embodiments of the present disclosure. An influence of the pulse width of the pulse laser on a performance of the laser sensor is described hereinafter with reference to FIG. 3 and FIG. 4.

Referring to FIG. 3, for the point cloud density, the narrower the pulse width of the pulse output by the pulse laser is, the higher the limit pulse repetition frequency is. To ensure that the pulses output by the pulse laser may not be aliased with each other, the pulse repetition frequency of the pulse laser needs to ensure that two independent pulses are completely separated. Obviously, a minimum distance between adjacent pulses is limited by pulse widths of the pulses themselves. However, each pulse of the pulse laser (which is namely a transmission pulse) corresponds to a ranging point of the laser sensor, so that a repetition frequency of the pulse directly affects a point frequency of the laser sensor, which is namely the point cloud density. A specific relationship is that: the narrower the pulse width is, the higher the repetition frequency is, and the larger the point cloud density is.

Illustratively, with reference to FIG. 4, for the measurement accuracy and repeatability, the narrower the pulse width of the pulse output by the pulse laser is, the higher the timing accuracy is. Measurement accuracy and repeatability of a laser sensor based on a TOF principle are determined by timing accuracies of a transmission pulse and an echo pulse. A timing system may have a certain degree of random error, which means that a set timing point (a fixed measurement amplitude) may fluctuate to a certain degree. It can be seen for the same level of error that, a timing error finally caused by a narrow-pulse-width pulse S02 is much smaller than that of a wide-pulse-width pulse S0, which means that $\Delta t2 < \Delta t1$.

In addition, in FIGS. 3 and 4, integral values of all pulses are 1, and correspond to actual laser pulses, meaning that a total power/average power of all pulses is the same. It can be understood that, a same laser tube and a corresponding power supply module thereof are used, which means that a comparison is made in the case that other parameters except the pulse width are the same. Accordingly, the narrow-pulse-width pulse has an obviously higher peak power, and then the whole laser sensor has a higher theoretical limit ranging distance.

Accordingly, use of the narrow-pulse-width pulse laser is beneficial for improving the point cloud density, the ranging accuracy and repeatability, and the limit ranging distance of the laser sensor, and a laser pulser is a basic and important part in a pulsed TOF laser sensor.

The narrow-pulse-width pulse laser in accordance with some embodiments of the present disclosure include the circuit substrate 2, the laser chip 3, the capacitors 1, and the field effect transistor 4. The field effect transistor 4, the capacitor 1 and the laser chip 3 are all electrically connected to the circuit substrate 2, and the capacitor 1 is arranged between the field effect transistor 4 and the laser chip 3 along an extension direction of a gap between the field effect transistor 4 and the laser chip 3, thus optimizing a layout of structural components in the pulse laser. Specifically, by arranging the capacitors 1 between the field effect transistor 4 and the laser chip 3 in a column instead of a row, the layout of the structural components can be more compact. The more compact the layout is, the smaller the loop inductance is, the faster the discharge is, and the narrower the pulse width is. Therefore, it is beneficial for reducing the loop inductance of the pulse laser, thus making a discharge velocity of the pulse laser faster and narrowing a pulse width of a light pulse output by the pulse laser during operation, to realize the narrow-pulse-width pulse laser. The incorporation of the pulse laser described herein in a laser sensor is beneficial for improving a point cloud density, a ranging accuracy, measurement repeatability and a limit ranging distance of the laser sensor.

It should be noted that, while FIG. 1 shows four capacitors 1, this is merely illustrative. The narrow-pulse-width pulse laser provided by the embodiments of the present disclosure may include any suitable number of capacitors 1. The capacitors may be set based on requirements of the narrow-pulse-width pulse laser, which will not be repeated and limited herein.

It can be understood that the capacitors 1, the laser chip 3, the field effect transistor 4, and the circuit substrate 2 may be any suitable capacitor, laser chip, field effect transistor, and circuit substrate known to those skilled in the art and may be set based on the requirements of the narrow-pulse-width pulse laser, which will not be repeated and limited herein.

Figure 5:
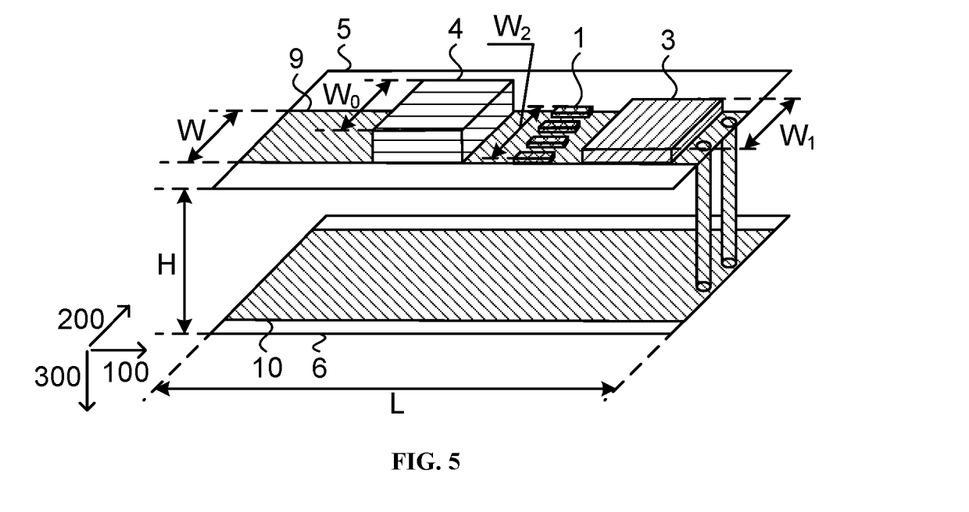
FIG. 5 is a schematic diagram of a stereoscopic structure of another narrow-pulse-width pulse laser in accordance with some embodiments of the present disclosure.

FIG. 5 is a schematic diagram of a stereoscopic structure of another narrow-pulse-width pulse laser in accordance with some embodiments of the present disclosure. As shown in FIG. 5, in the pulse laser, the circuit substrate 2 includes a first conductor layer 5, a second conductor layer 6, and an insulating layer 7 arranged between the first conductor layer 5 and the second conductor layer 6. The first conductor layer 5 and the second conductor layer 6 are electrically connected through a via hole in the insulating layer 7. As such, the via hole in the insulating layer 7 enables a conductor structure to pass through or fill, and the first conductor layer 5 and the second conductor layer 6 are electrically connected through the conductor structure in the via hole in the insulating layer 7. Along a direction 300 from the first conductor layer 5 to the second conductor layer 6, a thickness H of the insulating layer 7 satisfies that: H≤0.075 mm.

The first conductor layer 5 may be located on a top layer of the circuit substrate 2 and may be the connecting layer of the pulse laser. Each of the capacitor 1, the laser chip 3, and the field effect transistor 4 in the pulse laser is electrically connected to the first conductor layer 5.

The second conductor layer 6 may be located on a bottom layer of the circuit substrate 2 and may be the grounding layer of the pulse laser. The second conductor layer 6 is connected to the first conductor layer 5 to form a loop.

The insulating layer 7 is located between the first conductor layer 5 and the second conductor layer 6. The thickness H of the insulating layer may be referred to as a distance between the first conductor layer 5 and the second conductor layer 6. The via hole penetrating through the thickness is arranged in the insulating layer 7. The first conductor layer 5 and the second conductor layer 6 are electrically connected through the conductor structure in the via hole.

In combination with the above, by setting the distance between the first conductor layer 5 and the second conductor layer 6 as small as possible, such as being equal to or less than 0.075 mm, the parasitic inductance L_PCB of the circuit routing can be reduced, thus reducing the total loop inductance of the pulse laser, which is beneficial for improving the discharge velocity and narrowing the pulse width.

As an example, the insulating layer 7 may include an insulating material of 1080 model with a thickness of 0.075 mm or insulating materials of other models with a thickness of 0.075 mm. Alternatively, the thickness of the insulating layer 7 may be 0.07 mm, 0.05 mm, or any other suitable thickness values, which will not be limited herein.

The first conductor layer 5, the second conductor layer 6, and the conductor structure in the via hole may be made of any conductor material suitable for the circuit substrate 2 known to those skilled in the art, which may be the same or different, and will not be limited herein. Similarly, the insulating layer 7 may be made of any insulating material suitable for the circuit substrate 2 known to those skilled in the art, which may be the same or different, and will not be limited herein.

In the narrow-pulse-width pulse laser in accordance with some embodiments of the present disclosure, the smaller the distance between the first conductor layer 5 and the second conductor layer 6 is, the smaller the parasitic inductance L_PCB of the circuit routing is. Accordingly, the distance between the first conductor layer 5 and the second conductor layer 6 is set, which means that the thickness H of the insulating layer 7 satisfies that: H≤0.075 mm, which may reduce the parasitic inductance L_PCB of the circuit routing, make the discharge velocity of the pulse laser faster, and narrow the pulse width of the light pulse output by the pulse laser during operations, thus improving the point cloud density, the ranging accuracy/repeatability and the limit ranging distance of the laser sensor.

Referring to FIG. 5, the first conductor layer 5 may include a first conductor 9, and the second conductor layer 6 comprises a second conductor 10. The first conductor 9 and the second conductor 10 may be planar. The field effect transistor 4, the capacitors 1, and the laser chip 3 are all electrically connected to the first conductor 9. The vertical projections of the field effect transistor 4, the capacitors 1, and the laser chip 3 on the circuit substrate 2 are all located in the first conductor 9. Along an extension direction 200 of a gap between the field effect transistor 4 and the laser chip 3, relationships among a width $W_1$ of the laser chip 3, a total width $W_2$ of the capacitors 1, a width $W_0$ of the field effect transistor 4 and a width W of the first conductor 9 satisfy that: $W_1 \leq W_0$, $W_2 \leq W_0$, and $W_0 \leq W \leq 1.1 W_0$.

The width $W_0$ of the field effect transistor 4 and the width $W_1$ of the laser chip 3 may be regarded as being dimensions of the vertical projections of the field effect transistor 4 and the laser chip 3 on the circuit substrate 2 along the extension direction 200 of the gap between the field effect transistor 4 and the laser chip 3.

The total width $W_2$ of the capacitors 1 may be understood as a distance between outer edges of first and last capacitors 1 along the extension direction 200 of the gap between the field effect transistor 4 and the laser chip 3 in all capacitors 1 in the pulse laser, which means that the total width $W_2$ of the capacitors 1 is equal to a sum of widths of all capacitors 1 and gaps between all adjacent capacitors 1.

The width $W_1$ of the laser chip 3 is equal to or smaller than the width $W_0$ of the field effect transistor 4. The total width $W_2$ of the capacitors 1 is equal to or smaller than the width $W_0$ of the field effect transistor 4. The width $W_0$ of the field effect transistor 4 is equal to or smaller than the width W of the first conductor 9. Therefore, none of the widths of the field effect transistor 4, the capacitors 1, and the laser chip 3 electrically connected onto the first conductor 9 is greater than the width W of the first conductor 9. As such, the vertical projections of the structural components all fall within the first conductor 9.

In some embodiments, the wider the first conductor 9 is, the smaller the parasitic inductance L_PCB of the circuit routing in the circuit substrate 2 is. However, it is found by the applicant that, when the width $W_0$ of the field effect transistor 4 is defined, the current density of the circuit routing mainly concentrates within the width of the field effect transistor 4, and the excessively large width W of the first conductor 9 can significantly increase a parallel parasitic capacitance, while the parallel parasitic capacitance can slow down a rising edge of the pulse, which is not beneficial for narrowing the pulse width. Therefore, when the loop inductance is small enough, the parallel parasitic capacitance correspondingly formed by the width W of the first conductor 9 may be a main factor to slow down the rising edge and limit further narrowing of the pulse width. Therefore, an upper limit of the width W of the first conductor 9 is a value equivalent to the width $W_0$ of the field effect transistor 4. For example, the two widths may be equal, or the width W of the first conductor 9 is slightly larger than the width $W_0$ of the field effect transistor 4, and the two widths satisfy any value that $W \leq 1.1 W_0$, so as to avoid limiting the further narrowing of the pulse width.

Accordingly, the width $W_0$ of the field effect transistor 4 may be set as wide as possible, and the field effect transistor 4 may be set accordingly as a wide field effect transistor as much as possible, so that the width covers the total width $W_2$ of the capacitors 1 arranged side by side as much as possible, thus avoiding additionally increasing the limitation on the further narrowing of the pulse width.

In the narrow-pulse-width pulse laser in as described herein, by using a planar first conductor 9 in the first conductor layer 5, the width W of the first conductor 9 in the first conductor layer 5 is increased compared with thinner routing in a conductor layer in the related art. This is beneficial for narrowing the pulse width of the pulse output by the pulse laser. Meanwhile, by setting the width W of the first conductor 9 to be not excessively large, such as a width that satisfies $W_0 \leq W \leq 1.1 W_0$, the limitation of the further narrowing of the pulse width resulted from the excessively large width of the circuit routing is avoided while the small parasitic inductance L_PCB of the circuit routing is ensured, which is beneficial for giving full play to limit performances of the structural components, and further narrowing the pulse width of the pulse output by the pulse laser, thus being beneficial for improving the point cloud density, the ranging accuracy/repeatability and the limit ranging distance of the laser sensor.

Figure 6:
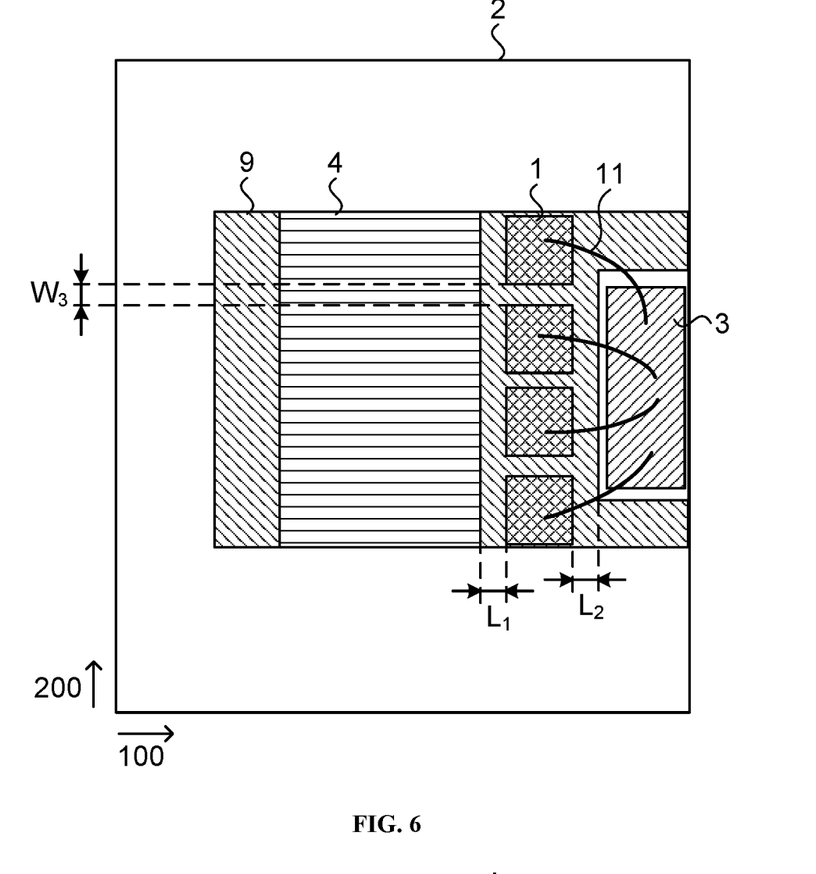
FIG. 6 is a schematic diagram of a cross-sectional view of yet another narrow-pulse-width pulse laser in accordance with some embodiments of the present disclosure.

FIG. 6 is a schematic diagram of a cross-sectional view of yet another narrow-pulse-width pulse laser in accordance with some embodiments of the present disclosure. With reference to FIG. 6, in the pulse laser, along the extension direction 200 of the gap between the field effect transistor 4 and the laser chip 3, a gap $W_3$ between two adjacent capacitors 1 satisfies that: $100 \ \mu m \leq W_3 \leq 120 \ \mu m$.

By such setting, on one hand, the total width $W_2$ of the capacitors 1 is prevented to be excessively large, and the total width $W_2$ of the capacitors 1 is ensured to be smaller than or equal to $W_0$, thus avoiding the parallel parasitic capacitance from being significantly increased due to the excessively large routing width to limit the further narrowing of the pulse width; and on the other hand, an electrical limit distance between adjacent capacitors 1 can be satisfied, all capacitors 1 can be ensured to be operated normally, and short circuit can be prevented. In addition, no extra processing difficulty is added, thus being easy to realize.

Illustratively, a value of the gap $W_3$ may be 100 μm, 120 μm and 110 μm, or the gap $W_3$ satisfies that: $110 \ \mu m \leq W_3 \leq 115 \ \mu m$, or the gap $W_3$ may be any other width value, which will not be limited herein.

In an embodiment, with reference to FIG. 6, in the pulse laser, along a direction 100 from the field effect transistor 4 to the laser chip 3, a gap $L_1$ between the capacitor 1 and the field effect transistor 4 satisfies that: $300 \ \mu m \leq L_1 \leq 360 \ \mu m$.

By such setting, on one hand, the gap between the field effect transistor 4 and the capacitor 1 is reduced as much as possible, thus shortening the length of the first conductor 9 as much as possible, which means that a dimension of the first conductor in the direction 100 is reduced, which is beneficial for reducing an overall routing length of the component, and reducing the parasitic inductance L_PCB of the circuit routing, so as to narrow the pulse width of the pulse output by the pulse laser; and on the other hand, the electrical limit distance between the field effect transistor 4 and the capacitor 1 can be satisfied, both the field effect transistor 4 and the capacitor 1 can be ensured to be operated normally, and short circuit can be prevented. In addition, no extra processing difficulty is added, thus being easy to realize.

Illustratively, a value of the gap $L_1$ may be 300 μm, 360 μm and 330 μm, or the gap $L_1$ satisfies that: $310 \ \mu m \leq L_1 \leq 315 \ \mu m$, or the gap $L_1$ may be any other width value, which will not be limited herein.

In an embodiment, with reference to FIG. 6, in the pulse laser, along a direction 100 from the field effect transistor 4 to the laser chip 3, a gap $L_2$ between the capacitor 1 and the laser chip 3 satisfies that: $200 \ \mu m \leq L_2 \leq 240 \ \mu m$.

By such setting, on one hand, the gap between the capacitor 1 and the laser chip 3 is reduced as much as possible, thus shortening the length of the first conductor 9 as much as possible, which means that a dimension of the first conductor in the direction 100 is reduced, which is beneficial for reducing an overall routing length of the component, and reducing the parasitic inductance L_PCB of the circuit routing, so as to narrow the pulse width of the pulse output by the pulse laser; and on the other hand, the electrical limit distance between the capacitor 1 and the laser chip 3 can be satisfied, both the capacitor 1 and the laser chip 3 can be ensured to be operated normally, and short circuit can be prevented. In addition, no extra processing difficulty is added, thus being easy to realize.

Illustratively, a value of the gap $L_2$ may be 200 μm, 240 μm and 220 μm, or the gap $L_2$ satisfies that: $210 \ \mu m \leq L_2 \leq 215 \ \mu m$, or the gap $L_2$ may be any other width value, which will not be limited herein.

In the implementation above, along the direction from the field effect transistor 4 to the laser chip 3, the larger the distance between the field effect transistor 4 and the outer edge of the laser chip 3 (which is namely an opposite outer side) is, the longer the length L of the circuit routing is. The length L of the circuit routing is equal to a sum of lengths of the field effect transistor 4, the capacitor 1 and the laser chip 3 along the direction 100 from the field effect transistor 4 to the laser chip 3, the gap $L_1$ between the capacitor 1 and the field effect transistor 4, the gap $L_2$ between the capacitor 1 and the laser chip 3, and a remaining length of first conductor 9 beyond the length ranges above. Therefore, the gap $L_1$ between the capacitor 1 and the field effect transistor 4 and the gap $L_2$ between the capacitor 1 and the laser chip 3 are set to satisfy the value ranges above, which is beneficial for controlling the length L of the circuit routing. Specifically, the layout of the structural components in the pulse laser can be more compact by reducing the gap between the structural components, which is beneficial for reducing the loop inductance of the pulse laser, making the discharge velocity of the pulse laser faster, and narrowing the pulse width of the light pulse output by the pulse laser during operation, thus being beneficial for improving the point cloud density, the ranging accuracy/repeatability and the limit ranging distance of the laser sensor.

Figure 7:
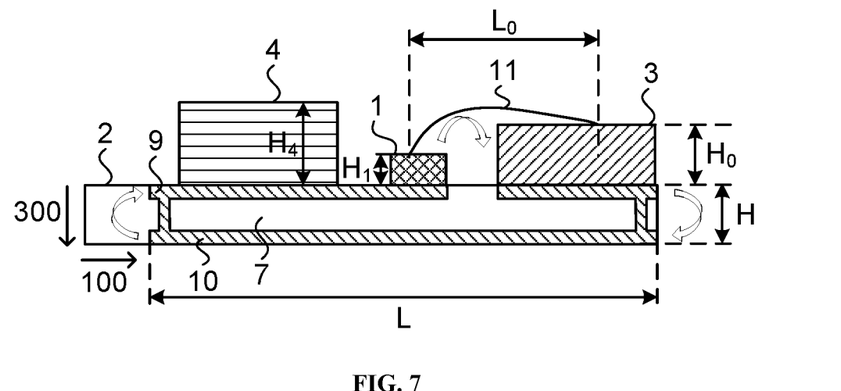
FIG. 7 is a schematic diagram of a sectional structure of yet another narrow-pulse-width pulse laser in accordance with some embodiments of the present disclosure.

In an embodiment, FIG. 7 is a schematic diagram of a sectional structure of yet another narrow-pulse-width pulse laser in accordance with some embodiments of the present disclosure. With reference to FIG. 7, in the pulse laser, along a direction 300 perpendicular to a plane in which the circuit substrate 2 is located, a height $H_1$ of the capacitor 1 is smaller than a height $H_4$ of the field effect transistor 4, and a height $H_0$ of the laser chip 3 is smaller than the height $H_4$ of the field effect transistor 4.

The height $H_1$ of the capacitor 1 and the height $H_0$ of the laser chip 3 may be the same or different, which will not be limited herein. Illustratively, the height $H_1$ of the capacitor 1 and the height $H_0$ of the laser chip 3 may both be 100 μm, and the height $H_4$ of the field effect transistor 4 may be 105 μm, or may be set to be any other height value. It is only necessary to select a dimension as small as possible while satisfying performance requirements of the pulse laser, which will not be repeated and limited herein.

In the pulse laser, in addition to a loop surrounded by two conductor layers (such as two layers of PCB routing/copper skins) in the circuit substrate 2, there is another loop influenced by the height $H_1$ of the capacitor 1, the height $H_0$ of the laser chip 3 and a horizontal span of a gold wire (described in detail later). In the same way as the above, the longer the path of the loop is, the stronger the corresponding parasitic inductance is. Therefore, in the embodiment, the height $H_1$ of the capacitor 1 and the height $H_0$ of the laser chip 3 are set as small as possible, which is beneficial for reducing the parasitic inductance, then accelerating the discharge, and narrowing the pulse width.

In the narrow-pulse-width pulse laser in accordance with some embodiments of the present disclosure, the capacitor 1, the laser chip 3, and the field effect transistor 4 are all electrically connected onto the circuit substrate 2, and both the heights of the capacitor 1 and the laser chip 3 are set to be smaller than that of the field effect transistor 4, which cannot increase an extra height of the pulse laser, thus being easy to realize miniaturization design of the pulse laser. In addition, the heights of the capacitor 1 and the laser chip 3 are set to be small, which is beneficial for reducing the parasitic inductance of the corresponding loop, thus making the discharge velocity of the pulse laser faster, and narrowing the pulse width of the light pulse output by the pulse laser during operation, so as to be beneficial for improving the point cloud density, the ranging accuracy/repeatability and the limit ranging distance of the laser sensor.

In one embodiment, with reference to FIGS. 6-7, the capacitors 1 may be and/or include a bare-die capacitor. The laser chip 3 may be and/or include a laser bare chip. The pulse laser may further include the gold wire 11. On one side far away from the circuit substrate 2, the bare-die capacitor and the laser bare chip are connected through the gold wire 11.

The bare-die capacitor is a capacitor without a package structure, and the laser bare chip is a laser chip without a package structure. By setting the capacitor 1 to include the bare-die capacitor and the laser chip 3 to include the laser bare chip, corresponding dimensions of the packaging structures can be reduced, which may reduce overall dimensions of the capacitor 1 and the laser chip 3, so that the capacitor 1 and the laser chip 3 are as small as possible, thus shortening the path of the corresponding loop. Meanwhile, since the capacitor 1 and the laser chip 3 do not have the packaging structures, the capacitor and the laser chip may be directly connected to the first conductor 9, to realize the connection to the circuit substrate 2. Meanwhile, the capacitor and the laser chip are connected through the gold wire 11 instead of connection through a pin, which further shortens the path of the corresponding loop, and reduces the parasitic inductance of the corresponding loop, thus being beneficial for narrowing the pulse width.

Optionally, the bare-die capacitor and the laser bare chip are connected through the gold wire 11 by a bonding process, and a bonding point on the bare-die capacitor and a bonding point on the laser bare chip are both arranged on one side surface far away from the circuit substrate 2, so that an operation space of the bonding process is large, and a process difficulty is low.

Furthermore, the bonding points on the bare-die capacitor and the laser bare chip may be arranged at edge positions close to each other on upper surfaces of the bare-die capacitor and the laser bare chip, which is beneficial for reducing the horizontal span of the gold wire 11, which means that a length of the gold wire 11 in a plane defined by the direction 100 and the direction 200 is reduced. The smaller the horizontal span is, the smaller the parasitic inductance of the corresponding loop is, thus being beneficial for reducing the parasitic inductance, and narrowing the pulse width.

Figure 8:
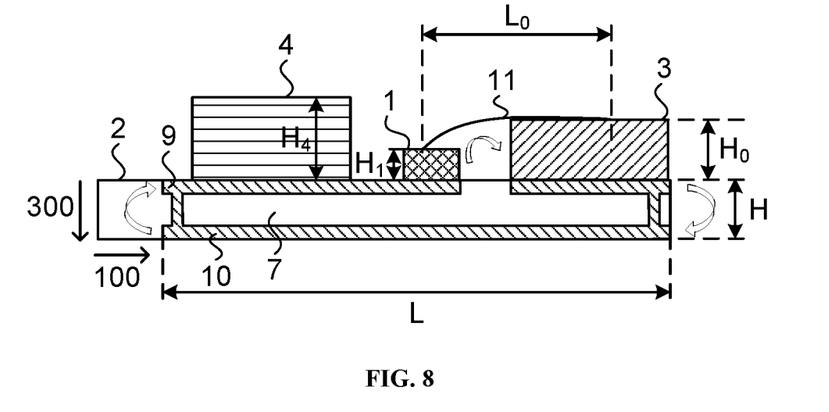
FIG. 8 is a schematic diagram of a sectional structure of yet another narrow-pulse-width pulse laser in accordance with some embodiments of the present disclosure.
Figure 9:
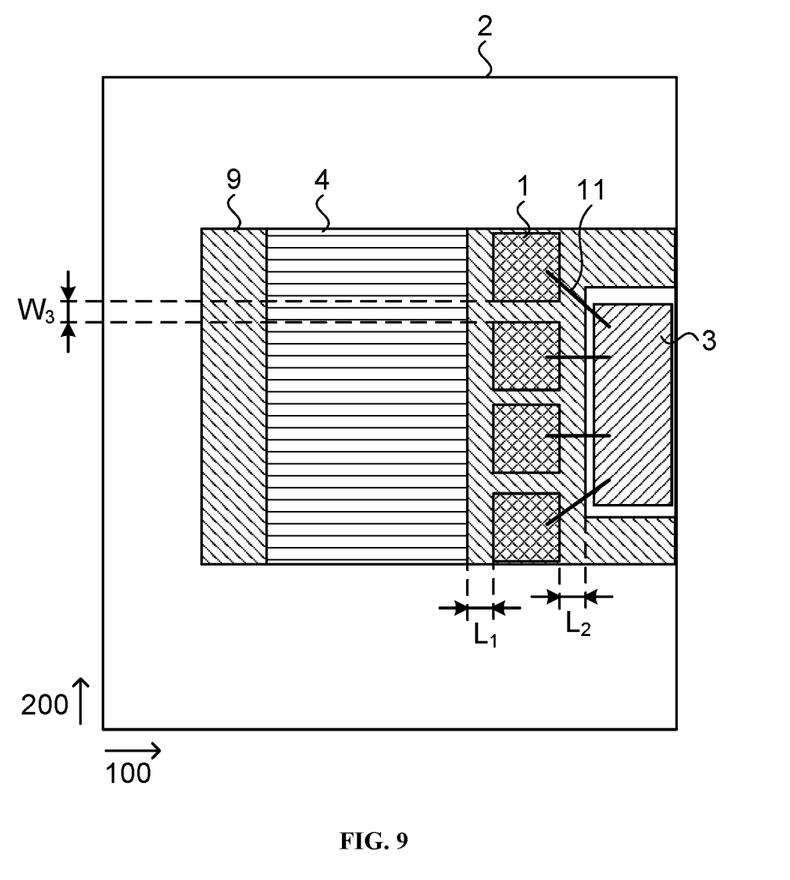
FIG. 9 is a schematic diagram of a cross-sectional view of yet another narrow-pulse-width pulse laser in accordance with some embodiments of the present disclosure.

Further, the gold wire 11 is tightly attached to electrodes on the upper surfaces of the bare-die capacitor and the laser bare chip, as shown in FIGS. 8 and 9. In this way, it is beneficial for reducing the length of the gold wire 11 in the plane defined by the direction 100 and the direction 200, and is also beneficial for reducing a height of the gold wire 11 in the direction 300, thus being beneficial for reducing the path of the corresponding loop, reducing the parasitic inductance of the corresponding loop, and narrowing the pulse width.

Further, with reference to FIG. 9, a vertical projection of the gold wire 11 on the circuit board 2 is a straight line, which is beneficial for reducing the length of the gold wire 11 in the plane defined by the direction 100 and the direction 200, thus being beneficial for reducing the path of the corresponding loop, reducing the parasitic inductance of the corresponding loop, and narrowing the pulse width.

It can be understood that FIG. 6 to FIG. 9 only illustratively show the bare-die capacitor of the capacitor 1, when the laser chip 3 is the laser bare chip, the bare-die capacitor and the laser bare chip are electrically connected through the gold wire 11, which does not constitute a limitation on the pulse laser in accordance with some embodiments of the present disclosure. In other implementations, the bare-die capacitor and the laser bare chip may also be electrically connected through wires made of other materials known to those skilled in the art or by other methods. In addition, the capacitor 1 and the laser chip 3 may also be any capacitor and laser chip known to those skilled in the art and may be set based on requirements of the pulse laser, which will not be repeated and limited herein.

In an embodiment, the bare-die capacitor is a thin film silicon capacitor. In an embodiment, the field effect transistor is a gallium nitride (GaN) enhanced mode power transistor.

By such setting, on one hand, a peak power of laser light in the pulse laser, a peak current of the field effect transistor and a capacitance requirement of the capacitor can be satisfied; and on the other hand, in the pulse laser, the dimensions of the structural component are small enough, and the parasitic inductance is small enough, thus being beneficial for narrowing the pulse width. Meanwhile, the parasitic capacitance is small enough, which also contributes to narrowing the pulse width to some extent. For example, the smaller the input capacitance of the field effect transistor is, the more beneficial it is for narrowing the pulse width of the pulse laser.

In other implementations, the bare-die capacitor may also be other bare-die capacitors capable of satisfying the performance requirements of the pulse laser known to those skilled in the art in addition to the thin film silicon capacitor, and the field effect transistor may also be other field effect transistors capable of satisfying the performance requirements of the pulse laser known to those skilled in the art in addition to the gallium nitride enhanced mode power transistor. Selected types of the bare-die capacitor and the field effect transistor may be combined at will, which will not be limited herein.

In addition, when two or more bare-die capacitors are provided, types of the bare-die capacitors may be the same or different, which will not be limited herein.

In the pulse laser in accordance with some embodiments of the present disclosure, the selected types of the bare-die capacitor and the field effect transistor are limited, which is beneficial for reducing the loop inductance of the pulse laser, thus making the discharge velocity of the pulse laser faster, and narrowing the pulse width of the light pulse output by the pulse laser during operation, so as to be beneficial for improving the point cloud density, the ranging accuracy/repeatability and the limit ranging distance of the laser sensor.

Figure 10:
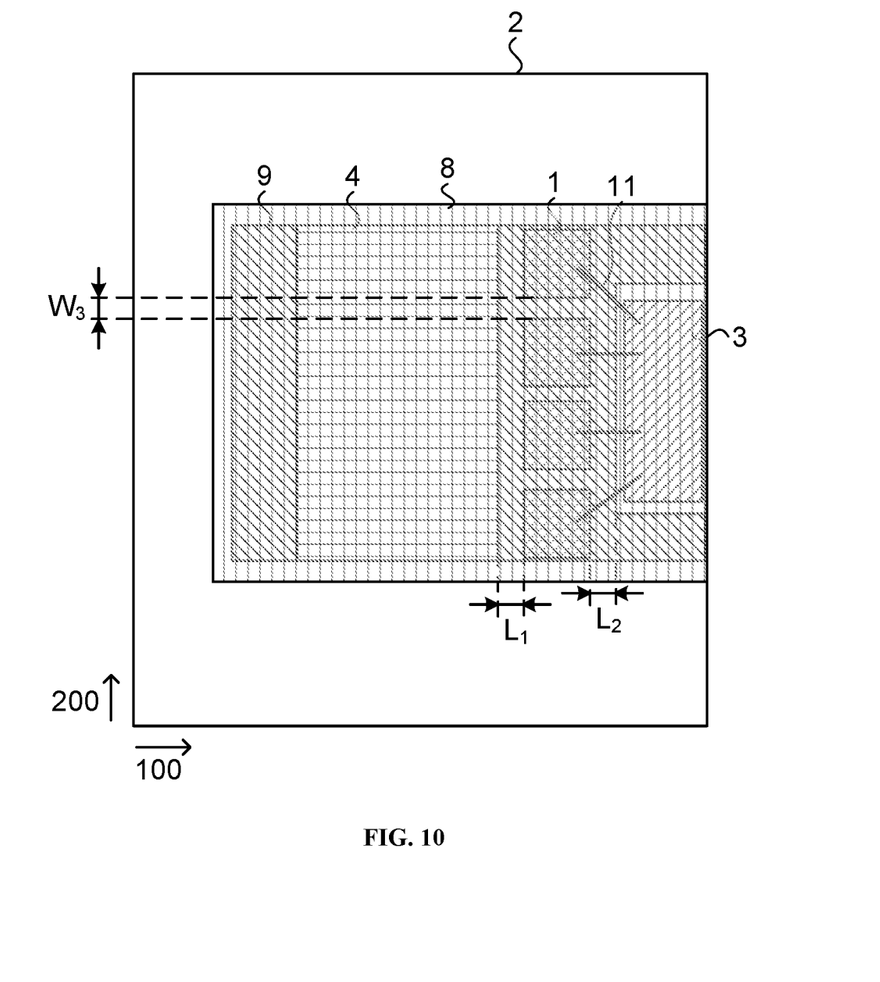
FIG. 10 is a schematic diagram of a cross-sectional view of yet another narrow-pulse-width pulse laser in accordance with some embodiments of the present disclosure.

FIG. 10 is a schematic diagram of a cross-sectional view of yet another narrow-pulse-width pulse laser in accordance with some embodiments of the present disclosure. With reference to FIG. 10, the pulse laser further comprises an insulating paste 8. The insulating paste 8 covers the bare-die capacitor, the laser bare chip, the gold wire 11, and bare areas of the field effect transistor 4 and the circuit substrate to provide insulation protection for the components of the narrow-pulse-width laser.

The bare-die capacitor, the laser bare chip and the gold wire 11 are all in a semiconductor structure and have no packaging structure. The bare-die capacitor, the laser bare chip and the gold wire are covered with the insulating paste, and the bare areas of the field effect transistor 4 and the circuit substrate 2 are covered synchronously, so that the bare-die capacitor, the laser bare chip and the gold wire 11 are subjected to insulation protection, and the whole pulse laser is subjected to insulation protection, and a structural stability of the pulse laser is enhanced at the same time.

For example, the insulating paste may be made of any material known to those skilled in the art, which will not be repeated and limited herein.

In other implementations, the pulse laser may also be packaged by other methods known to those skilled in the art, to realize insulation protection, which will not be limited herein.

By such setting, on one hand, the bare-die capacitor, the laser bare chip, the gold wire 11, and the bare areas of the field effect transistor 4 and the circuit substrate 2 are subjected to insulation protection, so that aging delay, corrosion speed reduction, performance attenuation reduction, and prolonged service life of the circuit and the structural components are realized; and on the other hand, the insulating paste packages the whole pulse laser, which can exert a certain stabilizing effect, thus improving a stability of a whole structure of the pulse laser, so as to be beneficial for ensuring a good performance and prolonging a service life of the pulse laser.

Further, the insulating paste 8 may also be a heat-conducting paste for assisting the structural components in the pulse laser to dissipate heat to avoid a problem that a temperature of the pulse laser is changed excessively due to heat concentration, thus ensuring that the pulse laser is operated in a suitable temperature range with the good performance and ensuring that the pulse laser has the good performance.

For example, the insulating paste 8 may also be an epoxy resin. In other implementations, the insulating paste 8 may also be other pastes with covering and heat-conducting functions known to those skilled in the art, which will not be repeated and limited herein.

In other implementations, the pulse laser may further comprise other functional components or structural components known to those skilled in the art, which will not be repeated and limited herein.

It should be noted that relational terms such as "first" and "second", and the like, used herein are only intended to distinguish one entity or operation from another entity or operation, and do not necessarily require or imply that any such actual relationship or sequence exists between these entities or operations. Furthermore, the terms "comprise", "include", or any other variation thereof, are intended to cover a non-exclusive inclusion, such that a process, method, article, or equipment that comprises a list of elements not only includes those elements but also includes other elements not expressly listed, or further includes elements inherent to such a process, method, article, or equipment. In a case without further limitations, an element defined by the phrase "comprising one . . . " does not preclude the presence of additional identical elements in the process, method, article, or equipment that includes the element.

The foregoing descriptions are only specific embodiments of the present disclosure, such that those skilled in the art can understand or realize the present disclosure. Many modifications to these embodiments will be obvious to those skilled in the art, and general principles defined herein may be realized in other embodiments without departing from the spirit or scope of the present disclosure. Therefore, the present disclosure will not be limited to these embodiments shown herein but should comply with the widest scope consistent with the principles and novel features disclosed herein.

INDUSTRIAL APPLICABILITY

According to the narrow-pulse-width pulse laser provided by the present disclosure, by optimizing the layout of the structural components in the pulse laser, the distance between the field effect transistor and the laser chip is reduced, so that the layout of the structural components is more compact, which is beneficial for reducing the loop inductance of the pulse laser, thus making the discharge velocity of the pulse laser faster, and narrowing the pulse width of the pulse output by the pulse laser during operation, so as to realize the narrow-pulse-width pulse laser. Further, when the narrow-pulse-width pulse laser is applied to a laser sensor, a high point cloud density, a high ranging accuracy, a better repeatability and a large limit ranging distance can be realized.

What is claimed is:

1. A narrow-pulse-width pulse laser, comprising:
a circuit substrate, comprising:
a first conductor layer;
a second conductor layer; and an insulating layer arranged between the first conductor layer and the second conductor layer, wherein the first conductor layer and the second conductor layer are electrically connected through a via hole in the insulating layer;

a laser chip;

one or more capacitors;

a field effect transistor;

wherein each of the field effect transistor, the one or more capacitors, and the laser chip is electrically connected to the circuit substrate;

wherein the one or more capacitors are arranged between the field effect transistor and the laser chip along an extension direction of a gap between the field effect transistor and the laser chip;

wherein the first conductor layer comprises a first conductor and the second conductor layer comprises a second conductor, where the first conductor and the second conductor are planar;

wherein each of the field effect transistor, the one or more capacitors, and the laser chip is electrically connected to the first conductor, wherein vertical projections of the field effect transistor, the one or more capacitors, and the laser chip on the circuit substrate are located in the first conductor; and wherein along the extension direction of the gap between the field effect transistor and the laser chip, relationships among a width $W_1$ of the laser chip, a total width $W_2$ of the one or more capacitors, a width $W_0$ of the field effect transistor and a width $W$ of the first conductor satisfy that:

$W_1 \le W_0$, $W_2 \le W_0$, and $W_0 \le W \le 1.1 W_0$, wherein the one or more capacitors comprise a bare-die capacitor, and wherein the laser chip comprises a laser bare chip;

wherein the bare-die capacitor comprises a thin film silicon capacitor, and wherein the field effect transistor comprises a gallium nitride enhanced mode power transistor;

wherein the narrow-pulse-width pulse laser further comprises a gold wire;

wherein on one side far away from the circuit substrate, the bare-die capacitor and the laser bare chip are connected through the gold wire; and an insulating paste that covers the bare-die capacitor, the laser bare chip, the gold wire, and bare areas of the field effect transistor and the circuit substrate to provide insulation protection.

2. The narrow-pulse-width pulse laser of claim 1, wherein, along a direction from the first conductor layer to the second conductor layer, a thickness H of the insulating layer is equal to or less than 0.075 mm.

3. The narrow-pulse-width pulse laser of claim 1, wherein the narrow-pulse-width pulse laser comprises a plurality of capacitors, and wherein along the extension direction of the gap between the field effect transistor and the laser chip, a gap $W_3$ between two adjacent capacitors of the plurality of capacitors satisfies that: $100\ \mu m \le W_3 \le 120\ \mu m$.

4. The narrow-pulse-width pulse laser of claim 1, wherein along a direction from the field effect transistor to the laser chip, a gap $L_1$ between the one or more capacitors and the field effect transistor satisfies that: $300\ \mu m \le L_1 \le 360\ \mu m$.

5. The narrow-pulse-width pulse laser of claim 1, wherein along a direction from the field effect transistor to the laser chip, a gap $L_2$ between the one or more capacitors and the laser chip satisfies that: $200\ \mu m \le L_2 \le 240\ \mu m$.

6. The narrow-pulse-width pulse laser of claim 1, wherein along a direction perpendicular to a plane in which the circuit substrate is located, a height of the one or more capacitors is smaller than that of the field effect transistor, and a height of the laser chip is smaller than that of the field effect transistor.

* * * * *